(12) United States Patent
Nakai

(10) Patent No.: US 7,978,114 B2
(45) Date of Patent: Jul. 12, 2011

(54) ANALOG-TO-DIGITAL CONVERSION APPARATUS AND METHOD

(75) Inventor: Hiroshi Nakai, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/709,056

(22) Filed: Feb. 19, 2010

(65) Prior Publication Data
US 2010/0214146 A1 Aug. 26, 2010

(30) Foreign Application Priority Data
Feb. 24, 2009 (JP) ................................. 2009-040256

(51) Int. Cl.
*H03M 1/12* (2006.01)
(52) U.S. Cl. ................. 341/155; 326/30; 333/3
(58) Field of Classification Search .......... 341/130–160; 326/30, 62, 80–90; 327/72–94; 600/547; 363/74; 307/65, 84; 333/3, 17.3; 713/322, 713/321, 503; 324/637, 645, 322
See application file for complete search history.

(56) References Cited

U.S. PATENT DOCUMENTS

| | | | |
|---|---|---|---|
| 6,151,006 A * | 11/2000 | Yanagi et al. | 345/94 |
| 6,255,865 B1 * | 7/2001 | Opris | 327/94 |
| 6,703,908 B1 * | 3/2004 | Ruesch et al. | 333/17.3 |
| 6,815,979 B2 | 11/2004 | Ooshita | |
| 7,437,252 B2 * | 10/2008 | Sutardja | 702/65 |
| 2004/0000926 A1 | 1/2004 | Ooshita | |

FOREIGN PATENT DOCUMENTS

| JP | 10-293999 A | 11/1998 |
|---|---|---|
| JP | 2004-040332 A | 2/2004 |

* cited by examiner

*Primary Examiner* — Lam T Mai
(74) *Attorney, Agent, or Firm* — Sughrue Mion, PLLC

(57) ABSTRACT

The A/D conversion apparatus includes an A/D converter for converting a potential difference between a reference voltage input and a voltage input to be measured to a digital signal and outputting the digital signal; a first switch connected between a voltage source to be measured and the voltage input to be measured; a first sampling capacitor having a first end connected to the voltage input to be measured and to a first end of the first switch, and having a second end connected to a reference power source; a second switch connected between a reference voltage source and the reference voltage input; a second sampling capacitor having a first end connected to the reference voltage input and to a first end of the second switch, and having a second end connected to the reference power source; and an impedance adjusting circuit, which is connected between the reference voltage source and a second end of the second switch, for changing, in stepwise fashion, impedance between the reference voltage source and the second end of the second switch.

10 Claims, 7 Drawing Sheets

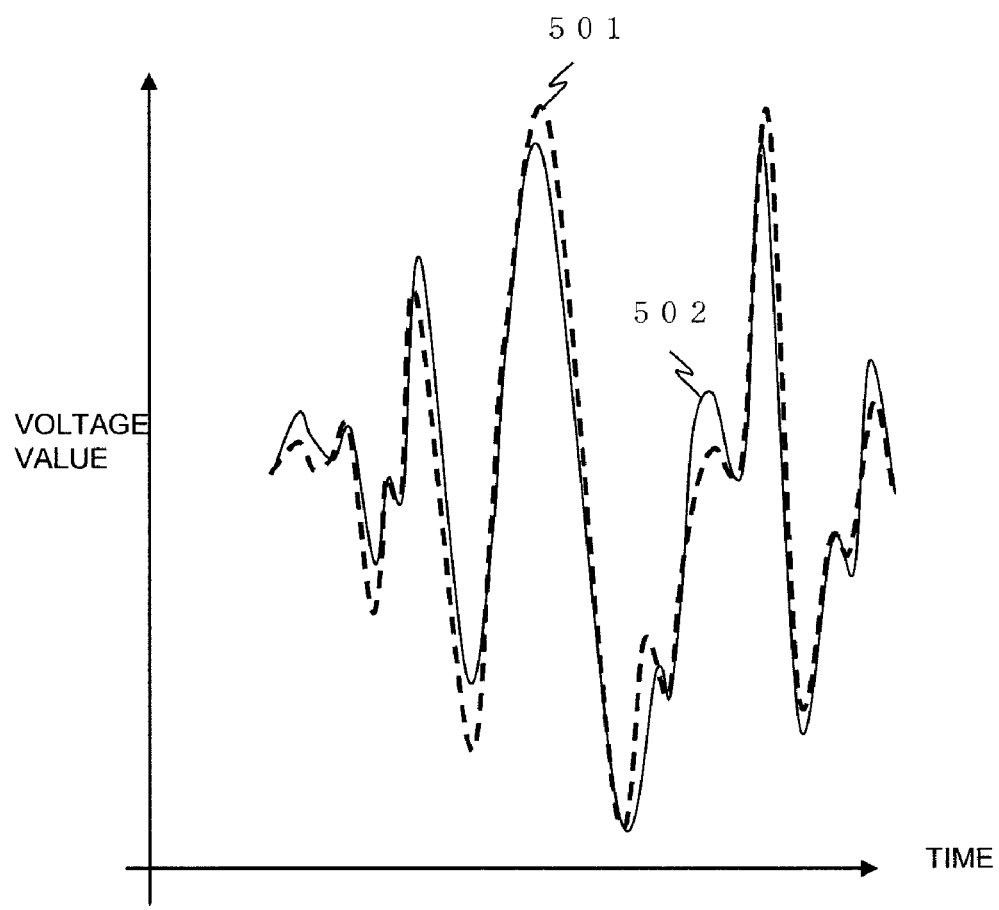
FIG. 6  REFERENCE CASE

FIG. 7  REFERENCE CASE
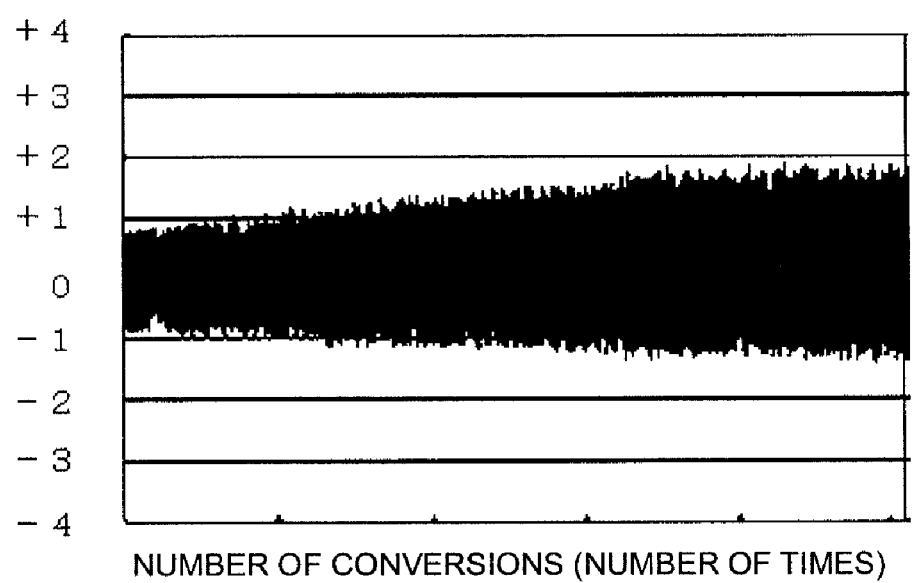
NUMBER OF CONVERSIONS (NUMBER OF TIMES)

ANALOG-TO-DIGITAL CONVERSION APPARATUS AND METHOD

REFERENCE TO RELATED APPLICATION

This application is based upon and claims the benefit of the priority of Japanese patent application No. 2009-040256, filed on Feb. 24, 2009, the disclosure of which is incorporated herein in its entirety by reference thereto.

TECHNICAL FIELD

This invention relates to an analog-to-digital conversion apparatus and method. More particularly, the invention relates to an analog-to-digital (A/D) conversion apparatus and method for charging a sampling capacitor to the voltage of a voltage source to be measured and performing an A/D conversion based upon the electric charge to which the sampling capacitor has been charged.

BACKGROUND

Many products in wide use such as digital cameras and printers have analog circuits such as an A/D conversion circuit mounted on an SOC (System-on-a-Chip). In an SOC product equipped with such analog circuits, improvements in the integration and speed of semiconductor chips have been accompanied by a shorter distance between elements and higher chip operating speed. As a consequence, there is a marked increase in the influence of the operating noise of digital circuits and the like in analog circuits. Hence there is growing demand for a better noise-resistance characteristic.

Further, the frequency components of operating noise produced by an internal circuit or I/O buffer, which is mounted in a multi-pin semiconductor package and operates at various frequencies within the chip, differs depending upon the chip, and measures for dealing with noise in individual chips has become important.

FIG. 5 is a circuit diagram of a sample-and-hold unit 1 of a chopper-type A/D conversion circuit that employs the conventional sample-and-hold circuit described in Patent Document 1. In this A/D conversion circuit using the conventional sample-and-hold circuit, switches 11$a$, 11$b$ are turned on and off in accordance with a sampling clock. When the switches 11$a$, 11$b$ have been turned on, a reference voltage and a voltage to be measured are caused to accumulate in capacitance elements 12$a$, 12$b$, respectively. A sampling potential on the side of the reference voltage and a sampling potential on the side of the voltage to be measured, which have accumulated in the capacitance elements 12$a$, 12$b$, respectively, are compared by a comparator circuit (not shown) on the output side, an A/D conversion operation is performed based upon the result of the comparison, and the result of the comparison is converted to a digital signal.

In Patent Document 1, it is described that series resistance values Ra, Rb of the switch elements and capacitance values Ca, Cb of the capacitance elements are selected to satisfy the equation $(Za+Ra) \times Ca = (Zb+Rb) \times Cb$ so as to compensate for a discrepancy between output impedance Za of a reference voltage source 21 and output impedance Zb of a voltage source 22 to be measured, and that the time constant on the side of the reference voltage and the time constant on the side of the voltage to be measured are equalized to thereby diminish the feed-through phenomenon and implement accurate sample-and-hold.

Patent Document 2 describes an impedance control circuit whereby the output impedances of a plurality of output buffer circuits in a semiconductor integrated circuit can be set to respective ones of different output impedances by a single a control circuit.

[Patent Document 1] Japanese Patent Kokai Publication No. JP-A-10-293999

[Patent Document 2] Japanese Patent Kokai Publication No. JP-P2004-40332A

The entire disclosures of Patent Documents 1 and 2 are incorporated herein by reference thereto.

The following analysis is given in the present invention. It is described in Patent Document 1 that the series resistance values of the switch elements and the capacitance values of the capacitance elements are designed beforehand in conformity with the voltage source to be measured. With a sequential-comparison-type A/D conversion apparatus used at low speed, however, there are also many cases where the input to one A/D conversion circuit is used upon changing over connection to circuits having a variety of impedances, such as monitor circuits for sensor output or power source voltage. If in such cases the voltage to be measured is input from a circuit having an impedance different from that on the side of the reference voltage, then a clock, etc., generated by a digital circuit in the semiconductor chip will travel through the semiconductor substrate and influence A/D conversion accuracy in the form of substrate noise. Further, there are many cases where the output impedance of the voltage to be measured is not known in advance.

FIG. 6 illustrates a temporal change in a sampling potential 501 on the side of reference voltage and in a sampling potential 502 on the side of a voltage to be measured in a case where substrate noise is present. Even if there is a potential variation between the sampling potential 501 on the side of the reference voltage and the sampling potential 502 on the side of the voltage to be measured owing to substrate noise, it is possible to cancel out the noise if it is in-phase noise. However, in a case where the time constants differ between the side of the reference voltage and the side of the voltage to be measured, the influence of substrate noise is not equalized between the side of the reference voltage and the side of the voltage to be measured. A measurement error is produced, therefore, by substrate noise. Accordingly, even though the voltage to be measured is the same voltage, different measurement results are obtained when measurement is performed multiple times, as illustrated in FIG. 7.

Accordingly, an accurate A/D conversion apparatus and method not susceptible to the influence of substrate noise are sought.

SUMMARY

An A/D conversion apparatus according to a first aspect of the present invention comprises: an A/D converter for converting a potential difference between a reference voltage input and a voltage input to be measured to a digital signal and outputting the digital signal; a first switch connected between a voltage source to be measured and the voltage input to be measured; a first sampling capacitor having a first end connected to the voltage input to be measured and to a first end of the first switch, and having a second end connected to a reference power source; a second switch connected between a reference voltage source and the reference voltage input; a second sampling capacitor having a first end connected to the reference voltage input and to a first end of the second switch, and having a second end connected to the reference power source; and an impedance adjusting circuit, which is connected between the reference voltage source and a second end of the second switch, for changing, in stepwise fashion, impedance between the reference voltage source and the second end of the second switch.

An A/D conversion method according to another aspect of the present invention uses an A/D conversion circuit that includes an A/D converter for converting a potential difference between a reference voltage input and a voltage input to be measured to a digital signal and outputting the digital signal; a first switch connected between a voltage source to be measured and the voltage input to be measured; a first sampling capacitor having a first end connected to the voltage input to be measured and to a first end of the first switch, and having a second end connected to a reference power source; a second switch connected between a reference voltage source and the reference voltage input; a second sampling capacitor having a first end connected to the reference voltage input and to a first end of the second switch, and having a second end connected to the reference power source; and an impedance adjusting circuit, which is connected between the reference voltage source and a second end of the second switch, for changing, in stepwise fashion, an impedance value between the reference voltage source and the second end of the second switch; the method comprising: a first step of changing the impedance value of the impedance adjusting circuit with the voltage of the voltage source to be measured held fixed, performing an A/D conversion a plurality of times for every impedance value, and obtaining a variation in A/D conversion measurement for every impedance value; a second step of obtaining an impedance value for which the measurement variation found in the first step is smallest; and a third step of setting the impedance value obtained in the second step in the impedance adjusting circuit and performing an A/D conversion with regard to the voltage source to be measured.

In accordance with the present invention, it is possible to perform an A/D conversion having a high measurement accuracy with little susceptibility to substrate noise.

BRIEF DESCRIPTIONS OF THE DRAWINGS

FIG. 6 is a diagram useful in describing the reason why measurement error is produced by substrate noise; and FIG. 7 is a diagram useful in describing A/D conversion error.

PREFERRED MODES

Exemplary embodiments of the present invention will be described with reference to the drawings as necessary. It should be noted that the drawings and drawing symbols cited in the description of the exemplary embodiments indicate an example of the exemplary embodiments and do not limit variations of the exemplary embodiments according to the present invention.

Figure 1:
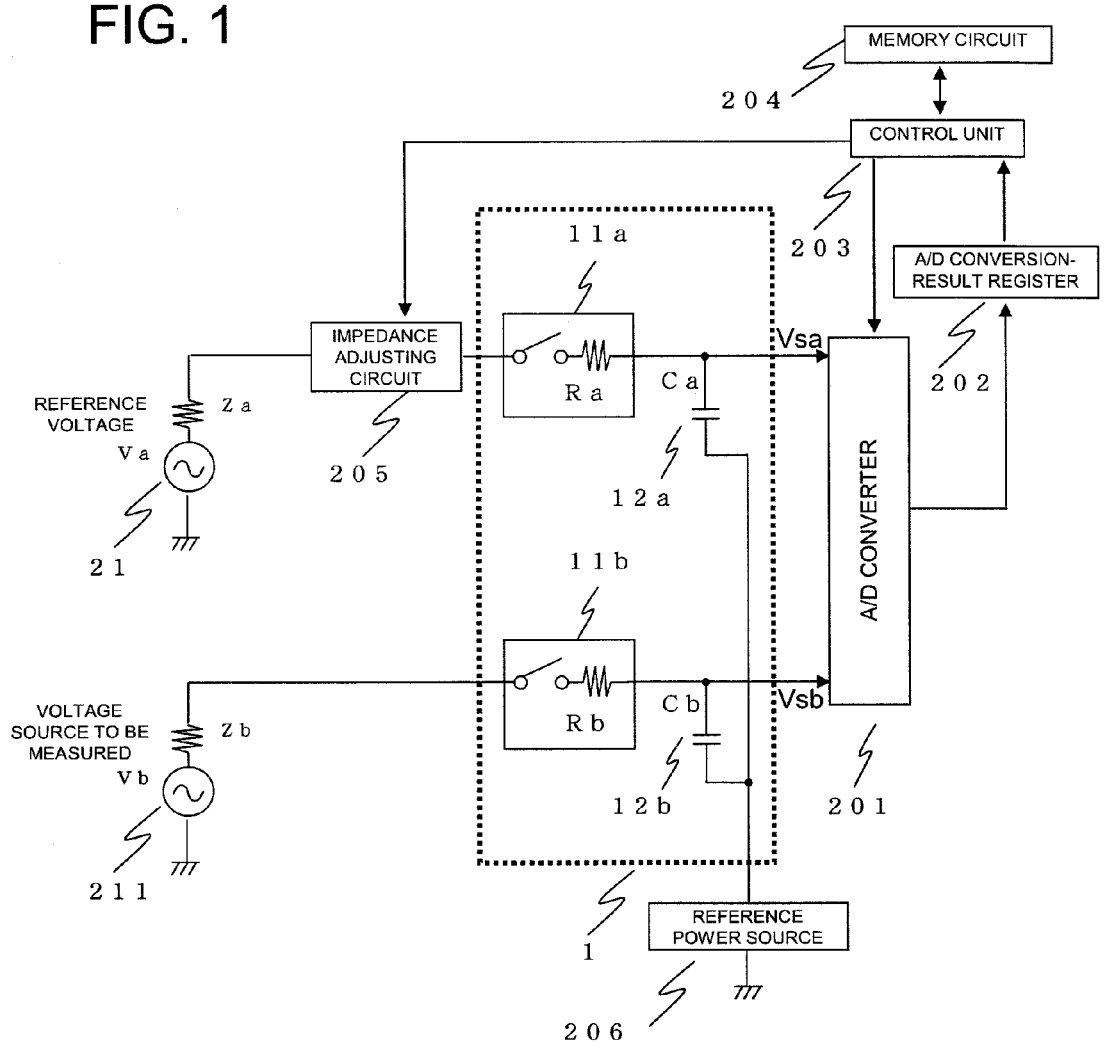
FIG. 1 is a block diagram of an A/D conversion apparatus according to an embodiment of the present invention.
Figure 3:
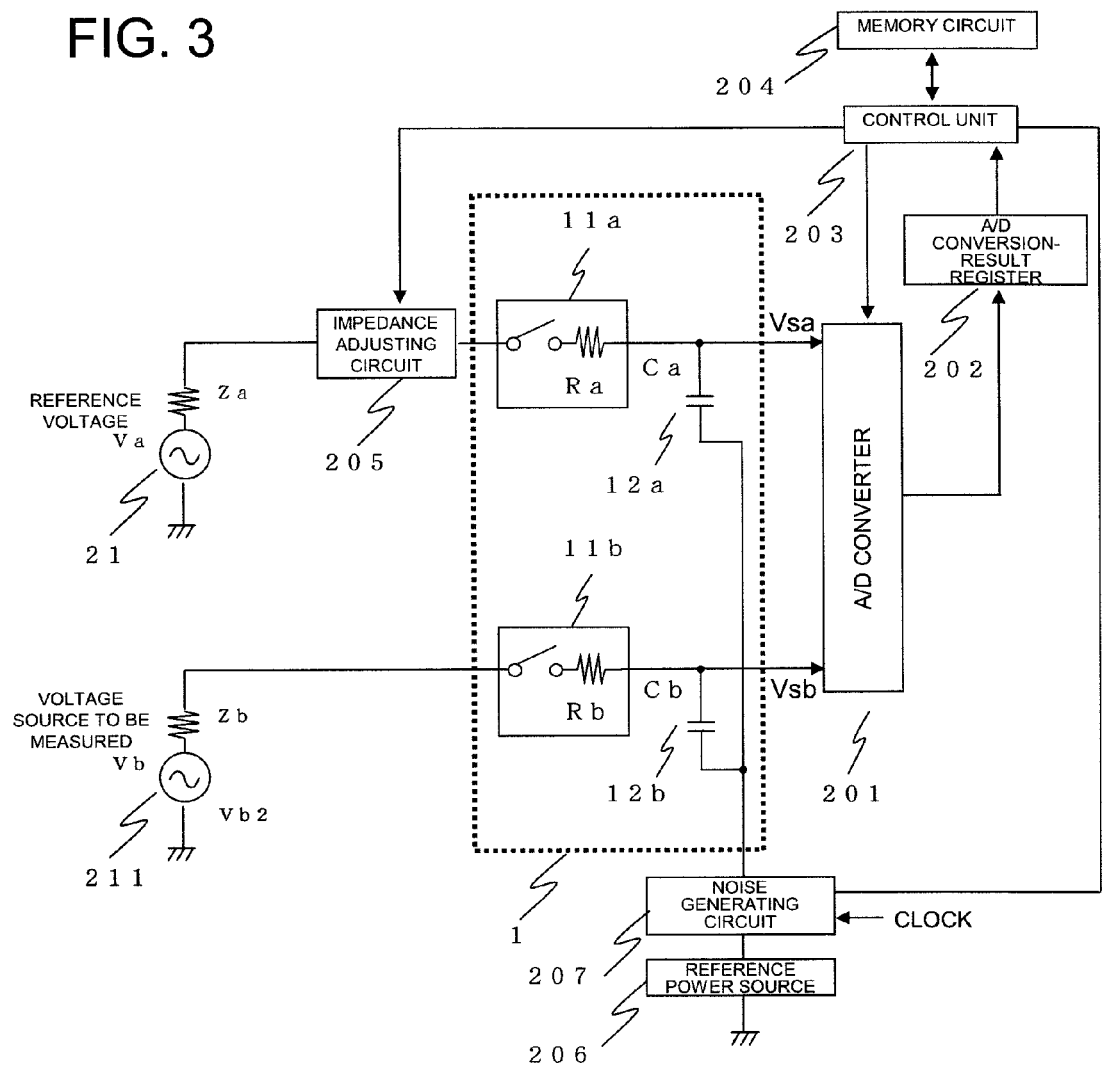
FIG. 3 is a block diagram of an A/D conversion apparatus according to another embodiment of the present invention.

As illustrated for example in FIGS. 1 and 3, an A/D conversion apparatus according to exemplary embodiments of the present invention includes an A/D converter 201 for converting a potential difference between a reference voltage input Vsa and a voltage input Vsb to be measured to a digital signal and outputting the digital signal; a first switch 11$b$ connected between a voltage source 211 to be measured and the voltage input Vsb to be measured; a first sampling capacitor Cb having a first end connected to the voltage input Vsb to be measured and to a first end of the first switch 11$b$, and having a second end connected to a reference power source 206; a second switch 11$a$ connected between a reference voltage source 21 and the reference voltage input Vsa; a second sampling capacitor Ca having a first end connected to the reference voltage input Vsa and to a first end of the second switch 11$a$, and having a second end connected to the reference power source 206; and an impedance adjusting circuit 205, which is connected between the reference voltage source 21 and a second end of the second switch 11$a$, for changing, in stepwise fashion, impedance between the reference voltage source 21 and the second end of the second switch 11$a$.

As illustrated for example in FIGS. 1 to 4, the A/D conversion apparatus according to exemplary embodiments of the present invention further includes a control unit 203 for fixing the voltage of the voltage source 211 to be measured, varying the impedance of the impedance adjusting circuit 205, causing the A/D converter 201 to perform an A/D conversion a plurality of times for every impedance, selecting the impedance value for which A/D conversion error is smallest between identical impedance values, setting the selected impedance value as the impedance value of the impedance adjusting circuit 205, and causing measurement of the voltage value of the voltage source 211 to be measured. That is, the impedance of the impedance adjusting circuit 205 is changed and the A/D conversion is performed a plurality of times for each and every impedance value. Depending upon the impedance value of the impedance adjusting circuit 205, the amount of influence of substrate noise upon the A/D conversion differs. For example, if the time constants of the reference voltage source and voltage source to be measured are equal, then the effects of substrate noise become equal between the reference voltage source and voltage source to be measured and the influence of noise upon the result of A/D conversion should be minimized. Since it is conceivable that the direction of the error that substrate noise imposes upon the A/D conversion value can be both positive and negative, the A/D conversion is performed a plurality of times and the measurement error thereof is measured for each and every impedance value. If the impedance value having the smallest measurement error is set in the impedance adjusting circuit 205 and the A/D conversion performed, then the accuracy of the A/D conversion can be improved. The control unit 203 controls the impedance adjusting circuit 205 and selects the impedance value for which the measurement error is smallest.

Figure 2:
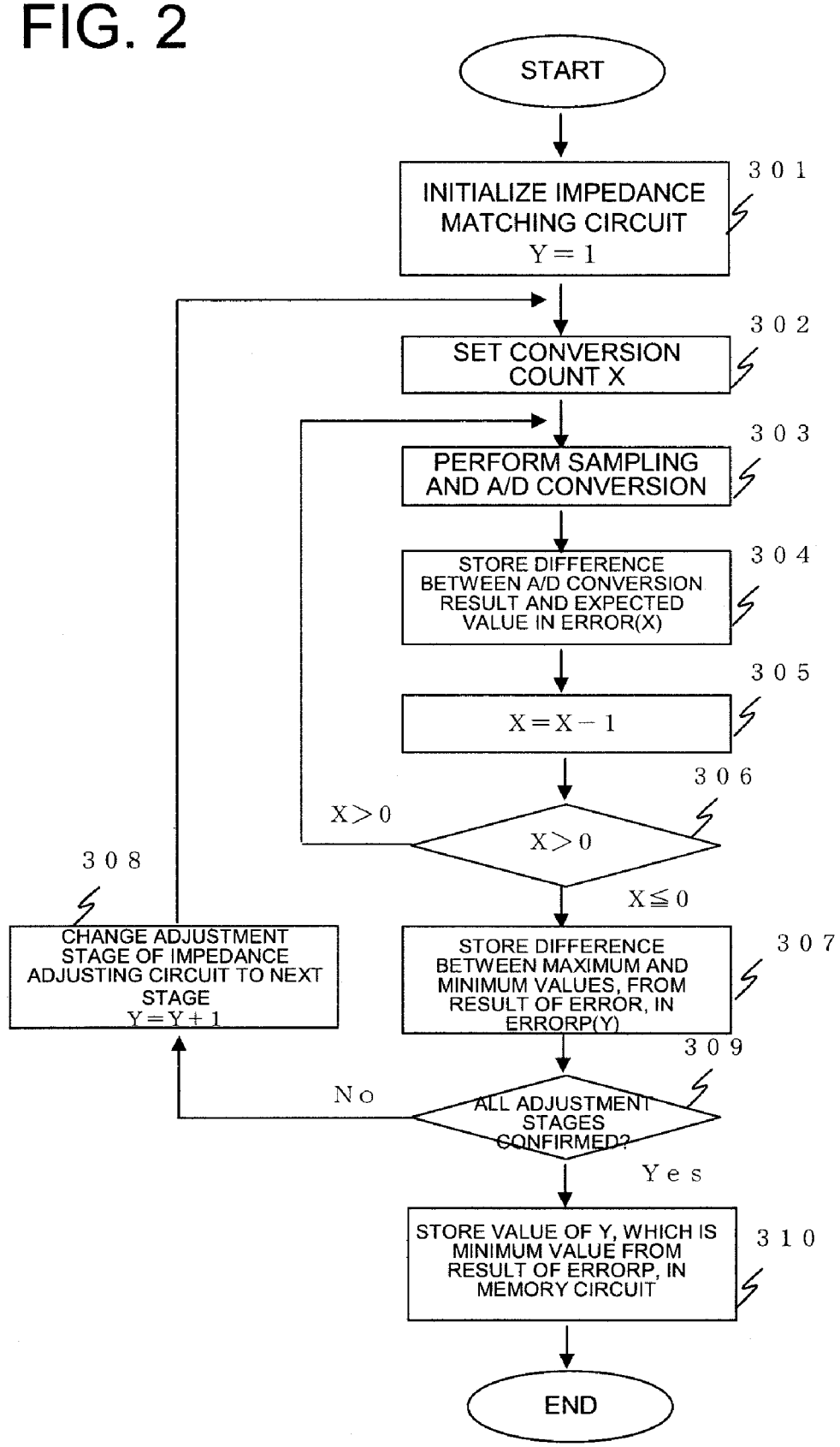
FIG. 2 is a processing flowchart illustrating an A/D conversion processing method according to the embodiment of the present invention.
Figure 4:
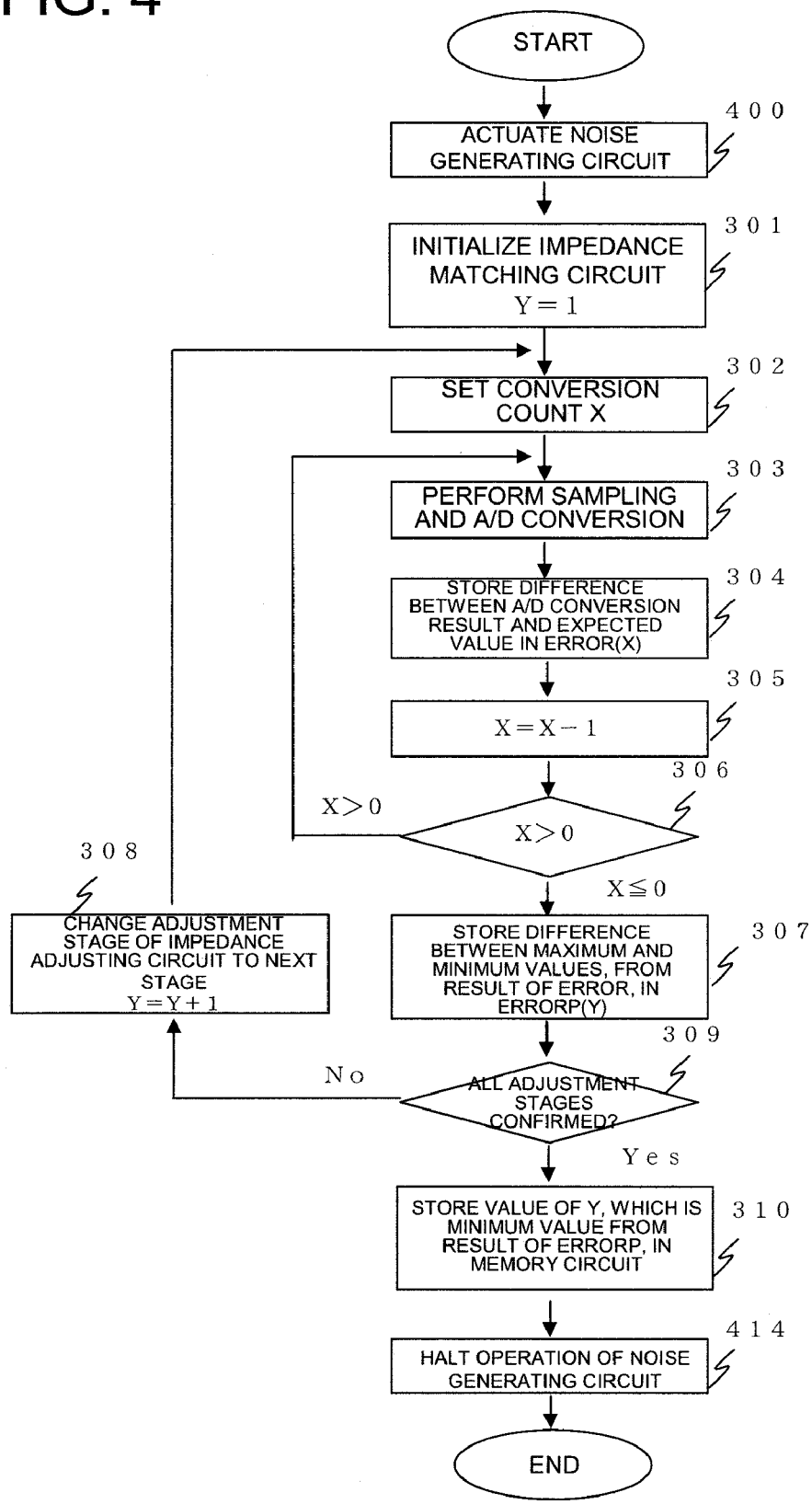
FIG. 4 is a processing flowchart illustrating an A/D conversion processing method according to the other embodiment of the present invention.
Figure 5:
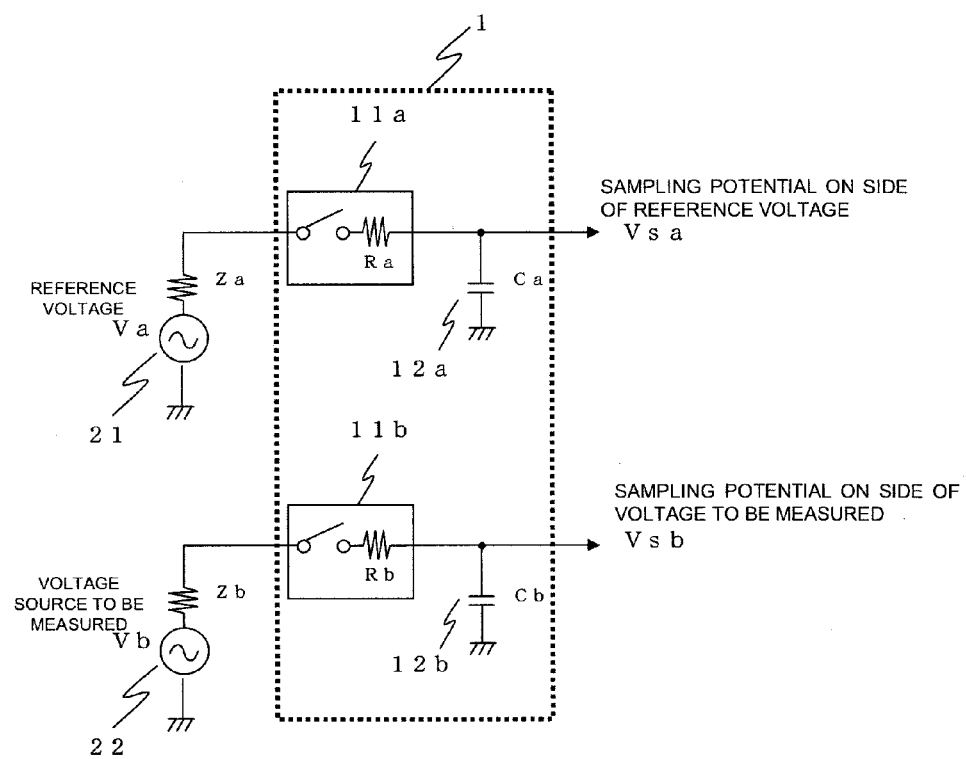
FIG. 5 is a block diagram of an A/D conversion circuit according to the prior art described in Patent Document 1.

Further, as illustrated for example in FIGS. 2 and 4, the A/D conversion apparatus according to the exemplary embodiments obtains maximum and minimum values of the A/D conversion values for every impedance value set by the impedance adjusting circuit 205, and selects the impedance value for which the difference between the maximum and minimum values is smallest as the impedance value for which the A/D conversion error is smallest (see steps 307 and 310 in FIGS. 2 and 4).

Further, as illustrated for example in FIGS. 2 and 4, the A/D conversion apparatus according to the exemplary embodiments of the present invention further includes a memory circuit 204. The control unit 203 stores the impedance value, which has been selected as the impedance value for which the A/D conversion error is smallest, in the memory circuit 204 beforehand. Once the selected impedance value has been stored in the memory circuit 204, a highly accurate, optimized A/D conversion can be executed in simple fashion if, when an A/D conversion is carried out with regard to the same voltage source to be measured, the impedance value of the impedance adjusting circuit 205 for which the measurement error is smallest with respect to this voltage source to be measured is read out of the memory circuit and set in the impedance adjusting circuit 205.

Further, as illustrated for example in FIG. 3, the A/D conversion apparatus according to the exemplary embodiment of the present invention further includes a noise generating circuit 207 connected between the first sampling capacitor Cb and second sampling capacitor Ca and the reference power source 206. The A/D converter 201 is caused to perform an A/D conversion in a state in which the noise generating circuit 201 is caused to generate noise, the impedance value for which the A/D conversion error is smallest is selected, the selected impedance value is set as the impedance value of the impedance adjusting circuit 205, and the A/D conversion is performed upon halting operation of the noise generating circuit 207. When the noise generating circuit 207 is provided and the optimum impedance value is adjusted by the impedance adjusting circuit 205, noise is generated by the noise generating circuit 207 intentionally, the optimum impedance value is selected and this optimum impedance value is set in the impedance adjusting circuit 205, after which the noise generating circuit 207 is halted and the A/D conversion applied to the voltage source to be measured.

Further, as illustrated for example in FIG. 3, the A/D conversion apparatus according to the exemplary embodiment is such that the noise generating circuit 207 is one that generates an operating clock as noise.

As illustrated for example in FIGS. 1 and 4, an A/D conversion method according to exemplary embodiments of the present invention uses an A/D conversion circuit that includes an A/D converter 201 for converting a potential difference between a reference voltage input Vsa and a voltage input Vsb to be measured to a digital signal and outputting the digital signal; a first switch 11b connected between a voltage source 211 to be measured and the voltage input Vsb to be measured; a first sampling capacitor Cb having a first end connected to the voltage input Vsb to be measured and to a first end of the first switch 11b, and having a second connected to a reference power source 206; a second switch 11a connected between a reference voltage source 21 and the reference voltage input Vsa; a second sampling capacitor Ca having a first end connected to the reference voltage input Vsa and to a first end of the second switch 11a, and having a second end connected to the reference power source 206; and an impedance adjusting circuit 205, which is connected between the reference voltage source 21 and a second end of the second switch 11a, for changing, in stepwise fashion, the impedance value between the reference voltage source 21 and the second end of the second switch 11a; the method including: a first step (step 307, etc.) of changing the impedance value of the impedance adjusting circuit 205 with the voltage of the voltage source 211 to be measured held fixed, performing an A/D conversion a plurality of times for every impedance value, and obtaining a variation in A/D conversion measurement for every impedance value; a second step (step 310, etc.) of obtaining an impedance value for which the measurement variation found in the first step is smallest; and a third step of setting the impedance value obtained in the second step in the impedance adjusting circuit 205 and performing an A/D conversion with regard to the voltage source 21 to be measured. Although there is no description in FIGS. 2 and 4 directly relating to the third step, the third step is reached if the impedance value of the impedance adjusting circuit 205 is set to an optimum value and the A/D conversion performed following step 310 or 414.

Further, in the A/D conversion method according to the exemplary embodiment of the invention as illustrated in FIGS. 3 and 4, the A/D conversion circuit further includes a noise generating circuit 207 connected between the first sampling capacitor Cb and second sampling capacitor Ca and the reference power source 206. The measurement variation is obtained upon actuating the noise generating circuit 207 at the first step (see step 400), and the A/D conversion is performed upon halting operation of the noise generating circuit 207 at the third step (see step 414). That is, the third step is processing that follows step 414 in FIG. 4.

Further, in the A/D conversion method according to the exemplary embodiment of the invention as illustrated in FIG. 3, the noise generating circuit 207 is one that generates an operating clock as noise. The impedance adjustment by the impedance adjusting circuit can be performed using the operating clock, which causes the digital circuit to operate, as the noise generating circuit. The examples of the present invention will now be described in detail with reference to the drawings.

First Example

FIG. 1 is a block diagram of an A/D conversion apparatus according to an example of the present invention. As shown in FIG. 1, the voltage source 211 to be measured is connected to the voltage input Vsb to be measured, which is an input to the A/D converter 201, via the first switch 11b. The reference voltage source 21 is connected to the reference voltage input Vsa of the A/D converter 201 via the impedance adjusting circuit 205 and second switch 11a. Further, the voltage input Vsb to be measured and reference voltage input Vsa of the A/D converter 201 are connected to the reference power source 206 via the first sampling capacitor Cb and second sampling capacitor Ca, respectively. The impedance adjusting circuit 205 is capable of changing its impedance value in a stepwise manner. By connecting the impedance adjusting circuit 205 in series with output impedance Za of the reference voltage source 21, the output impedance of the reference voltage source 21 can be adjusted overall.

The first and second switches 11b, 11a and the first and second sampling capacitors Cb, Ca function as a sample-and-hold circuit 1. When the first and second switches 11b, 11a are both closed, the voltages of the voltage source 211 to be measured and of the reference voltage source 21 are charged in the second and first sampling capacitors Cb, Ca, respectively. If the first and second switches 11b, 11a are both opened, the A/D converter 201 starts the A/D conversion operation based upon the electric charge that was charged in the first and second sampling capacitors Cb, Ca up until just prior to the opening of both the first and second switches 11b, 11a. The switch capacitances of the first and second switches 11b, 11a when these switches are opened and closed act in the same direction as that of the reference voltage input and voltage input to be measured and therefore are designed in such a manner that the opening and closing of the switches will not affect the conversion error of the A/D converter 201 as noise. Further, even in a case where substrate noise or the like affects the sampling capacitors, if the effects upon the first and second sampling capacitors are identical, these effects will cancel each other out in the A/D converter 201 and therefore no A/D conversion error will result. In particular, the impedance adjusting circuit 205 is provided. Therefore, even in a case where output impedance Za of the reference voltage 21 and output impedance Zb of the voltage source 211 to be measured are different, the arrangement is such that the output impedance Za of the reference voltage source 21 is adjusted by the impedance adjusting circuit 205 so that substrate noise sustained by traveling through the semiconductor substrate from the digital circuitry within the semiconductor integrated circuit will be received equally by the reference voltage input Vsa and voltage input Vsb to be measured, thereby making it possible to reduce measurement error due to substrate noise.

Further, a register 202 for the result of the A/D conversion stores the digital value of the result of the A/D conversion measured by the A/D converter 201. On the basis of the result of the A/D conversion stored in the register 202, the control unit 203 adjusts the impedance value of the impedance adjusting circuit 205 and controls the A/D conversion operation of the A/D converter 201. The control unit 203 may be a microcomputer operated by a program stored in the memory circuit 204. Further, the control unit 203 stores the impedance value, which is to be set in the impedance adjusting circuit 205, in the memory circuit 204. The operation of the control unit 203 will be described in detail later. Further, the reference power source 206 is the power source of the first and second sampling capacitors Cb and Ca, respectively.

FIG. 2 is a flowchart of processing by the A/D conversion apparatus shown in FIG. 1. In a case where the control unit 203 is a microcomputer, the control unit 203 controls the overall A/D conversion apparatus of FIG. 1 by a program stored in the memory circuit 204 and executes the processing of the flowchart of FIG. 2. The operation of the A/D conversion apparatus of FIG. 1 will now be described with reference to FIG. 2.

At step 301, the control unit 203 sets the impedance value of the impedance adjusting circuit 205 to an initial state. For example, the initial state may be one in which the impedance value is set to the smallest impedance value among impedance values that the impedance adjusting circuit 205 is capable of setting in stepwise fashion. Further, the control unit 203 stores an initial value 1 as the value of a variable Y.

Next, at step 302, the control unit 203 sets a number X of times a conversion is performed. The conversion count X, which is the number of times A/D measurement is repeated at the same set value of impedance, is decided beforehand. Next, at step 303, the control unit 203 closes the first and second switches 11b, 11a to thereby load voltage Vb to be measured and reference voltage Va in the first and second capacitors Cb, Ca, respectively, then opens the first and second switches 11b, 11a to fix the electric charge of the first and second capacitors Cb, Ca, and then starts the A/D conversion by the A/D converter 201. The result of the A/D conversion is loaded in the register 202 for this purpose. At step 304, therefore, the control unit 203 stores the difference between the result of the A/D conversion and an expected value, which is known in advance, at a storage location of X of an array error ERROR (X) provided within the control unit 203. The control unit 203 decrements the variable X at step 305 and then returns to step 303 to repeat the A/D conversion until X becomes zero at step 306.

When the variable X becomes zero, the control unit 203 stores the difference between the maximum value and minimum value among the X-number of measurement errors, which have been stored in the array ERROR, in an array ERRORP(Y) provided within the control unit 203 at step 307. It should be noted that although the arrays ERRORP(Y) and ERROR(X) both use registers within the control unit 203, both of the arrays ERRORP(Y) and ERROR(X) may just as well be stored in an external storage device such as the memory circuit 204.

If it is found at step 309 that an impedance value for which the A/D conversion has not yet been carried out exists among the impedance values capable of being adjusted by the impedance adjusting circuit 205, then, at step 308, the control unit 203 changes the impedance value of the impedance adjusting circuit 205 to the next-stage impedance value, increments the variable Y and then returns control to step 302 to execute the A/D conversion. If it is found at step 309 that measurement of measurement error has been completed for all impedance values, then a difference between maximum and minimum values of A/D conversion values for every impedance value of impedance adjusting circuit 205 will have been stored in the array ERROR(Y) with regard to each impedance value. If the voltage Vb to be measured is constant, then the impedance value of the impedance adjusting circuit 205 prevailing when the difference between the maximum and minimum values of the A/D conversion values indicates the smallest value will exhibit the smallest variation in A/D conversion value. This can be said to be the optimum impedance value.

Accordingly, the value of Y with which is associated the smallest value of ERRORP in which the differences between maximum and minimum values of the A/D conversion values of every impedance value have been stored, namely the value of the impedance value, is stored in the memory circuit 204 at step 310. That is, by virtue of the processing flow of FIG. 2, the optimum impedance value set in the impedance adjusting circuit 205 is stored in the memory circuit 204 in a case where the voltage to be measured is subjected to the A/D conversion. Accordingly, in a case where a target voltage identical with the voltage to be measured is measured, the optimum impedance value found by the processing flow of FIG. 2 need only be read out of the memory circuit 204 and set in the impedance adjusting circuit 205.

Further, in a case where a voltage to be measured continues to be subjected to A/D conversion after the optimum impedance value shown in FIG. 2 has been found, if the control unit 203 applies the A/D conversion to this voltage after the optimum impedance value found by the processing flow of FIG. 2 is set in the impedance adjusting circuit 205, then the A/D conversion can be carried out under conditions in which the conversion error is smallest.

Second Example

A second example of the present invention will now be described. FIG. 3 is a block diagram of the A/D conversion apparatus according to the second example, in which components identical with those of the first example need not be described again. The A/D conversion apparatus of the second example shown in FIG. 3 is further provided with a noise generating circuit 207. The latter is connected between the first and second sampling capacitors Cb, Ca and the reference power source 206 and applies noise to the voltage input Vsb to be measured and reference voltage input Vsa of the A/D converter 201. Further, the noise generating circuit 207 is supplied with the operating clock from the digital circuitry of the semiconductor integrated circuit, and the operating clock inflicts measurement error upon the A/D converter 201 via the first and second sampling capacitors Cb, Ca. By adjusting the impedance adjusting circuit 205 so as to minimize the influence of this measurement error, the impedance value of the impedance adjusting circuit 205 can be set to a value that will be least likely to result in a measurement error. Further, a control signal is connected from the control unit 203 to the noise generating circuit 207, and the control unit 203 can exercise control to generate noise in the noise generating circuit 207 or to halt the generation of noise. With the exception of the noise generating circuit 207, other components of this example are substantially the same as those of the A/D conversion apparatus of the first example shown in FIG. 1.

Reference will now be had to the processing flowchart of FIG. 4 to describe processing for adjusting the optimum impedance value of the impedance adjusting circuit 205. Processing steps in the flowchart of FIG. 4 that are substantially identical with those in the flowchart of FIG. 2 are designated by like step numbers and need not be described again. In processing for finding the optimum impedance value to be set in the impedance adjusting circuit 205 in FIG. 4, first the noise generating circuit 207 is actuated at step 400. The reason for this is to intentionally apply noise to the reference voltage Va and voltage Vb to be measured and measure the size of the A/D conversion error due to noise that prevails when the impedance value is changed by the impedance adjusting circuit 205. The processing from step 301 to step 310 is identical with the processing in FIG. 2 of the first example. During this processing, however, the noise generating circuit 207 remains in operation and therefore measurement of the A/D conversion value is performed in a state in which all of the noise is superimposed upon the voltage to be measured and the reference voltage. Accordingly, when the noise generating circuit 207 is actuated, the A/D conversion is performed in a state in which error due to the noise is greater than error in the normal A/D conversion state. The impedance value for which the difference between the maximum and minimum values of measurement error is smallest is found at step 310 under these conditions. When this measurement ends, the noise generating circuit 207 is halted at step 414. In a case where the A/D conversion of the voltage to be measured is continued, if the impedance value of the impedance adjusting circuit 205 is set to the impedance value found at step 310 and the A/D conversion is carried out in the state in which the noise generating circuit 207 has been halted, then the A/D conversion can be performed under conditions in which the measurement due to substrate noise error is smallest.

In the second example, an impedance adjustment is made with the intentional application of noise by the noise generating circuit 207. This means that the impedance adjustment can be performed in a state in which the influence of noise is held fixed. Further, if the A/D conversion is performed in a state in which the noise generating circuit 207 has been halted after the impedance adjustment has been carried out, then an A/D conversion result of higher accuracy will be obtained.

In particular, by connecting the operating clock of a semiconductor chip to the noise generating circuit 207 as a noise generating source, noise can be superimposed upon the reference power source with the frequency of the noise made to conform to the operation of the semiconductor chip.

In a case where the control unit 203 is a microcomputer, the control unit 203 can be made to execute the A/D conversion method of FIGS. 2 and 4 by a program that has been stored in the memory circuit 204, etc. The A/D converter 201 and impedance adjusting circuit 205 of FIGS. 1 and 3 can be controlled by the control unit 203 using the program that has been stored in the memory circuit 204.

Though the present invention has been described in accordance with the foregoing examples, the invention is not limited to these examples and it goes without saying that the invention covers various modifications and changes that would be obvious to those skilled in the art within the scope of the claims.

What is claimed is:

1. An A/D conversion apparatus comprising:
    an A/D converter that converts a potential difference between a reference voltage input and a voltage input to be measured to a digital signal and outputs the digital signal;
    a first switch connected between a voltage source to be measured and the voltage input to be measured;
    a first sampling capacitor having a first end connected to the voltage input to be measured and to a first end of said first switch, and having a second end connected to a reference power source;
    a second switch connected between a reference voltage source and the reference voltage input;
    a second sampling capacitor having a first end connected to the reference voltage input and to a first end of said second switch, and having a second end connected to the reference power source; and
    an impedance adjusting circuit which is connected between the reference voltage source and a second end of said second switch and changes, in stepwise fashion, impedance between the reference voltage source and the second end of said second switch.

2. The apparatus according to claim 1, further comprising a control unit that fixes the voltage of the voltage source to be measured, varies the impedance of said impedance adjusting circuit, causes said A/D converter to perform an A/D conversion a plurality of times for each impedance value, selects the impedance value for which A/D conversion error is smallest between identical impedance values, sets the selected impedance value as the impedance value of said impedance adjusting circuit, and causes measurement of the voltage value of the voltage source to be measured.

3. The apparatus according to claim 2, wherein maximum and minimum values of the A/D conversion values for each impedance value set by said impedance adjusting circuit are obtained, and the impedance value for which the difference between the maximum and minimum values is smallest is selected as the impedance value for which the A/D conversion error is smallest.

4. The apparatus according to claim 2, further comprising a memory circuit;
    wherein said control unit stores the impedance value, which has been selected as the impedance value for which the A/D conversion error is smallest, in said memory circuit beforehand.

5. The apparatus according to claim 2, further comprising a noise generating circuit connected between said first and second sampling capacitors and said reference power source;
    wherein said A/D converter is caused to perform an A/D conversion in a state in which said noise generating circuit is caused to generate noise, the impedance value for which the A/D conversion error is smallest is selected, the selected impedance value is set as the impedance value of said impedance adjusting circuit, said the A/D conversion is performed upon halting operation of said noise generating circuit.

6. The apparatus according to claim 5, wherein said noise generating circuit is one that generates an operating clock as noise.

7. An A/D conversion method comprising:
    providing an A/D conversion circuit that includes an A/D converter for converting a potential difference between a reference voltage input and a voltage input to be measured to a digital signal and outputting the digital signal;
    a first switch connected between a voltage source to be measured and the voltage input to be measured; a first sampling capacitor having a first end connected to the voltage input to be measured and to a first end of the first switch, and having a second end connected to a reference power source; a second switch connected between a reference voltage source and the reference voltage input; a second sampling capacitor having a first end connected to the reference voltage input and to a first end of the second switch, and having a second end connected to the reference power source; and an impedance adjusting circuit, which is connected between the reference voltage source and a second end of the second switch, for changing, in stepwise fashion, an impedance value between the reference voltage source and the second end of the second switch;

changing the impedance value of the impedance adjusting circuit with the voltage of the voltage source to be measured held fixed, performing an A/D conversion a plurality of times for each impedance value, and obtaining a variation in A/D conversion measurement for each impedance value;

obtaining an impedance value for which the measurement variation found in said obtaining the variation is smallest; and setting the impedance value obtained in said obtaining the impedance value in the impedance adjusting circuit and performing an A/D conversion with regard to the voltage source to be measured.

8. The method according to claim 7, wherein the A/D conversion circuit has a noise generating circuit connected between said first and second sampling capacitors and said reference power source;

wherein in said obtaining the variation, the measurement variation is obtained upon actuating the noise generating circuit; and at said performing the A/D conversion with regard to the voltage source to be measured, the A/D conversion is performed upon halting operation of the noise generating circuit.

9. The method according to claim 8, wherein the noise generating circuit is one that generates an operating clock as noise.

10. The method according to claim 8, wherein the noise generating circuit generates a noise based on an operating clock of a digital circuit, the digital circuit being integrated in a semiconductor substrate with said A/D conversion circuit.

* * * * *